United States Patent [19]

Briggs

[11] Patent Number: 4,490,803
[45] Date of Patent: Dec. 25, 1984

[54] TEMPERATURE COMPENSATION OF A RESISTANCE BRIDGE CIRCUIT

[75] Inventor: Stephen A. Briggs, Solihull, England

[73] Assignee: Lucas Industries Limited, Birmingham, England

[21] Appl. No.: 356,316

[22] Filed: Mar. 9, 1982

[30] Foreign Application Priority Data

Apr. 3, 1981 [GB] United Kingdom ............... 8110475

[51] Int. Cl.³ .................... G01K 19/00; G01R 27/00; G01L 1/22
[52] U.S. Cl. ..................................... 364/571; 73/721; 73/727; 73/766; 73/862.63; 338/3; 364/482; 364/558
[58] Field of Search ............... 364/550, 571, 558, 863; 338/3, 5; 324/62 R; 364/482; 73/708, 721, 727, DIG. 4, 862.63, 766

[56] References Cited

U.S. PATENT DOCUMENTS

| | | | |
|---|---|---|---|
| 3,034,346 | 5/1962 | Starr | 338/3 X |
| 4,172,389 | 10/1979 | Branch | 73/766 |
| 4,174,639 | 11/1979 | Raven | 73/766 |
| 4,192,005 | 3/1980 | Kurtz | 364/558 X |
| 4,333,349 | 6/1982 | Mallon et al. | 73/727 X |

FOREIGN PATENT DOCUMENTS 8203121 9/1982 United Kingdom ............... 364/571

OTHER PUBLICATIONS

"A Temperature Compensated Silicon Strain Transducer" by P. F. Castle, published in 'Strain', Jan. 1974, pp. 22-25.

Primary Examiner—Errol A. Krass
Assistant Examiner—Kevin J. Teska
Attorney, Agent, or Firm—Stevens, Davis, Miller & Mosher

[57] ABSTRACT

A resistance bridge circuit is temperature compensated, for both zero error and sensitivity, over a predetermined temperature range by connecting a first compensating resistance in series with one resistor of the bridge, and a second compensating resistance in parallel with the same or an adjacent resistor of the bridge, to reduce zero error, the positions and values of the first and second resistances being determined from measurements, at a plurality of temperature levels, of the voltage levels and resistance values of the bridge, and on the arrangement of proposed external connections to the bridge. Third and fourth compensating resistances are connected in series and parallel respectively with the bridge as a whole, the values of the third and fourth resistances being dependent on measurements as aforesaid and on the proposed external connections. The four compensating resistances are the only compensating elements required to provide a predetermined zero error and sensitivity.

5 Claims, 26 Drawing Figures $X_1 Y_1$ (FIG.5) :—

$$a_x X_1^2 + b_x X_1 + c_x = 0$$

$a_x = \bar{V}_{RH} \bar{V}_{RC} (R_{1H} - R_{1C})$ $b_x = (R_{1H} - R_{1C}) \left[ \bar{V}_{RC} (\bar{V}_{RH} - 1) R_{2H} + \bar{V}_{RH} (\bar{V}_{RC} - 1) R_{2C} \right]$ $c_x = R_{1H} R_{1C} \left[ \bar{V}_{RC} (\bar{V}_{RH} - 1) R_{2H} - \bar{V}_{RH} (\bar{V}_{RC} - 1) R_{2C} \right]$
$\qquad + (\bar{V}_{RH} - 1)(\bar{V}_{RC} - 1) R_{2H} R_{2C} (R_{1H} - R_{1C})$ $$a_y Y_1^2 + b_y Y_1 + c_y = 0$$

$a_y = \bar{V}_{RH} \bar{V}_{RC} (R_{1H} - R_{1C}) + \left[ \bar{V}_{RC} (\bar{V}_{RH} - 1) R_{2H} - \bar{V}_{RH} (\bar{V}_{RC} - 1) R_{2C} \right]$ $b_y = (R_{1H} + R_{1C}) \left[ \bar{V}_{RC} (\bar{V}_{RH} - 1) R_{2H} - \bar{V}_{RH} (\bar{V}_{RC} - 1) R_{2C} \right]$ $c_y = R_{1H} R_{1C} \left[ \bar{V}_{RC} (\bar{V}_{RH} - 1) R_{2H} - \bar{V}_{RH} (\bar{V}_{RC} - 1) R_{2C} \right]$

FIG.9.

$\underline{X_2 Y_1 \ (FIG.6)}$ :—

$$a_x X_2^2 + b_x X_2 + c_x = 0$$

$$a_x = (\bar{V}_{RH}-1)(\bar{V}_{RC}-1)(R_{1H}-R_{1C})$$

$$b_x = (\bar{V}_{RH}-1)(\bar{V}_{RC}-1)(R_{1H}-R_{1C})(R_{2H}+R_{2C}) + R_{1H}R_{1C}(\bar{V}_{RH}-\bar{V}_{RC})$$

$$c_x = (\bar{V}_{RH}-1)(\bar{V}_{RC}-1)(R_{1H}-R_{1C})R_{2H}R_{2C} + R_{1H}R_{1C}\left[\bar{V}_{RC}(\bar{V}_{RH}-1)R_{2H} - \bar{V}_{RH}(\bar{V}_{RC}-1)R_{2C}\right]$$

$$a_y Y_1^2 + b_y Y_1 + c_y = 0$$

$$a_y = (\bar{V}_{RH}-1)(\bar{V}_{RC}-1)(R_{2H}-R_{2C}) + \bar{V}_{RH}(\bar{V}_{RC}-1)R_{1H} - \bar{V}_{RC}(\bar{V}_{RH}-1)R_{1C}$$

$$b_y = (\bar{V}_{RH}-1)(\bar{V}_{RC}-1)(R_{2H}-R_{2C})(R_{1H}+R_{1C}) - R_{1H}R_{1C}(\bar{V}_{RH}-\bar{V}_{RC})$$

$$c_y = (\bar{V}_{RH}-1)(\bar{V}_{RC}-1)(R_{2H}-R_{2C})R_{1H}R_{1C}$$

FIG. 10.

$\underline{X_1 Y_2 \text{ (FIG. 7)}}$ :—

$\underline{a_x X_1^2 + b_x X_1 + c_x = 0}$ $a_x = \bar{V}_{RC} \bar{V}_{RH} (R_{2H} - R_{2C})$ $b_x = \bar{V}_{RC} \bar{V}_{RH} (R_{2H} - R_{2C})(R_{1H} + R_{1C}) - R_{2H} R_{2C} (\bar{V}_{RH} - \bar{V}_{RC})$ $c_x = \bar{V}_{RC} \bar{V}_{RH} (R_{2H} - R_{2C}) R_{1H} R_{1C} + R_{2H} R_{2C} \left[ \bar{V}_{RH} (\bar{V}_{RC} - 1) R_{1H} - \bar{V}_{RC} (\bar{V}_{RH} - 1) R_{1C} \right]$ $\underline{a_y Y_2^2 + b_y Y_2 + c_y = 0}$ $a_y = \bar{V}_{RH} \bar{V}_{RC} (R_{1H} - R_{1C}) + \bar{V}_{RC} (\bar{V}_{RH} - 1) R_{2H} - \bar{V}_{RH} (\bar{V}_{RC} - 1) R_{2C}$ $b_y = \bar{V}_{RH} \bar{V}_{RC} (R_{1H} - R_{1C})(R_{2H} + R_{2C}) + R_{2H} R_{2C} (\bar{V}_{RH} - \bar{V}_{RC})$ $c_y = \bar{V}_{RH} \bar{V}_{RC} (R_{1H} - R_{1C}) R_{2H} R_{2C}$

FIG. 11.

$\underline{X_2 Y_2 \ (FIG.8)}$ :—

$\underline{a_x X_2^2 + b_x X_2 + c_x = 0}$ $a_x = (\bar{V}_{RC} - 1)(\bar{V}_{RH} - 1)(R_{2H} - R_{2C})$ $b_x = (R_{2H} - R_{2C})\left[\bar{V}_{RH}(\bar{V}_{RC} - 1)R_{1H} + \bar{V}_{RC}(\bar{V}_{RH} - 1)R_{1C}\right]$ $c_x = \bar{V}_{RH}\bar{V}_{RC}(R_{2H} - R_{2C})R_{1H}R_{1C} + R_{2H}R_{2C}\left[\bar{V}_{RH}(\bar{V}_{RC} - 1)R_{1H} - V_{RC}(\bar{V}_{RH} - 1)R_{1C}\right]$ $\underline{a_y Y_2^2 + b_y Y_2 + c_y = 0}$ $a_y = (\bar{V}_{RH} - 1)(\bar{V}_{RC} - 1)(R_{2H} - R_{2C}) + \left[\bar{V}_{RH}(\bar{V}_{RC} - 1)R_{1H} - \bar{V}_{RC}(\bar{V}_{RH} - 1)R_{1C}\right]$ $b_y = (R_{2H} + R_{2C})\left[\bar{V}_{RH}(\bar{V}_{RC} - 1)R_{1H} - \bar{V}_{RC}(\bar{V}_{RH} - 1)R_{1C}\right]$ $c_y = R_{2H}R_{2C}\left[\bar{V}_{RH}(\bar{V}_{RC} - 1)R_{1H} - \bar{V}_{RH}(\bar{V}_{RC} - 1)R_{1C}\right]$

FIG.12.

$$R_S = \frac{(\bar{S}_C - \bar{S}_H) K R_{BC}}{S_D (K-1)} \quad (9)$$

$$R_P = \frac{(\bar{S}_C - \bar{S}_H) K R_{BC}}{(K-1)(\bar{S}_C - S_D) - K(\bar{S}_C - \bar{S}_H)} \quad (10)$$

WHERE $K = \dfrac{R_{BH}}{R_{BC}}$ $$\bar{S}_C = S_C \cdot \frac{V_S}{V_{BC}} \quad (11)$$

$$\bar{S}_H = S_H \cdot \frac{V_S}{V_{BH}} \quad (12)$$

$$\frac{-\triangle V_{BC}}{V_{BC}^2} = R_S\left[\left(\frac{1}{R_{BC}}+\frac{1}{R_P}\right)\frac{\triangle R_S}{R_S} - \frac{\triangle R_P}{R_P^2}\right] \quad (13)$$

$$\frac{-\triangle V_{BH}}{V_{BH}^2} = R_S\left[\left(\frac{1}{R_{BH}}+\frac{1}{R_P}\right)\frac{\triangle R_S}{R_S} - \frac{\triangle R_P}{R_P^2}\right] \quad (14)$$

$$\triangle R_S = \frac{\frac{\triangle S_H}{S_H \bar{V}_{BH}} - \frac{\triangle S_C}{S_C \bar{V}_{BC}}}{\frac{1}{R_{BC}} - \frac{1}{R_{BH}}} \quad (15)$$

$$\triangle R_P = \frac{R_P^2}{R_S}\left[\triangle R_S\left(\frac{1}{R_P} + \frac{1}{R_{BC}}\right) + \frac{\triangle S_C}{S_C \bar{V}_{BC}}\right] \quad (16)$$

WHERE $\triangle S_C = S_D - S_C$ $\triangle S_H = S_D - S_H$ $\bar{V}_{BC} = \frac{V_{BC}}{V_S}$

FIG.16.

$$\Delta Y_1 = \frac{\dfrac{\bar{V}_{OH} R_{2H}}{\bar{V}_{LH}^2} - \dfrac{\bar{V}_{OC} R_{2C}}{\bar{V}_{LC}^2}}{\left(\dfrac{R_{1C}}{R_{1C}+Y_1}\right)^2 - \left(\dfrac{R_{1H}}{R_{1H}+Y_1}\right)^2}$$

$$\Delta X_1 = -\left(\frac{\bar{V}_{OC} R_{2C}}{\bar{V}_{LC}^2} + \left(\frac{R_{1C}}{R_{1C}+Y_1}\right)^2 \Delta Y_1\right)$$

WHERE $\quad \bar{V}_O = \bar{V}_R - \bar{V}_L$ $$\bar{V}_O = \frac{V_O}{V_B}, \quad \bar{V}_R = \frac{V_R}{V_B}, \quad \bar{V}_L = \frac{V_L}{V_B}$$

FIG.17.

$$\frac{\Delta Y_1}{Y_1} = \left[\frac{\dfrac{\bar{V}_{OC}(R_{2C}+X_2)}{\bar{V}_{LC}(1-\bar{V}_{LC})} - \dfrac{\bar{V}_{OH}(R_{2H}+X_2)}{\bar{V}_{LH}(1-\bar{V}_{LH})}}{R_{1H}\dfrac{(R_{2H}+X_2)}{(R_{1H}+Y_1)} - R_{1C}\dfrac{(R_{2C}+X_2)}{(R_{1C}+Y_1)}}\right]$$

$$\Delta X_2 = \left(\frac{\bar{V}_{OC}}{\bar{V}_{LC}(1-\bar{V}_{LC})} + \frac{R_{1C}}{(R_{1C}+Y_1)}\frac{\Delta Y_1}{Y_1}\right)(R_{2C}+X_2)$$

FIG.18.

$$\frac{\triangle Y_2}{Y_2} = \left[ \frac{\dfrac{\bar{V}_{OH}(R_{IH}+X_1)}{\bar{V}_{LH}(1-\bar{V}_{LH})} - \dfrac{\bar{V}_{OC}(R_{IC}+X_1)}{\bar{V}_{LC}(1-\bar{V}_{LC})}}{\dfrac{R_{2H}(R_{IH}+X_1)}{(R_{2H}+Y_2)} - \dfrac{R_{2C}(R_{IC}+X_1)}{(R_{2C}+Y_2)}} \right]$$

$$\triangle X_1 = \left( \frac{-\bar{V}_{OC}}{\bar{V}_{LC}(1-\bar{V}_{LC})} + \frac{R_{2C}}{(R_{2C}+Y_2)} \frac{\triangle Y_2}{Y_2} \right)(R_{IC}+X_1)$$

FIG. 19.

$$\triangle Y_2 = \frac{\dfrac{\bar{V}_{OC} R_{IC}}{(1-\bar{V}_{LC})^2} - \dfrac{\bar{V}_{OH} R_{IH}}{(1-\bar{V}_{LH})^2}}{\left(\dfrac{R_{2C}}{R_{2C}+Y_2}\right)^2 - \left(\dfrac{R_{2H}}{R_{2H}+Y_2}\right)^2}$$

$$\triangle X_2 = \frac{\bar{V}_{OC} R_{IC}}{(1-\bar{V}_{LC})^2} - \left(\frac{R_{2C}}{R_{2C}+Y_2}\right)^2 \triangle Y_2$$

FIG. 20.

$$\Delta Y_1 = \frac{\dfrac{\bar{V}_{OH}\left(X_1 + \dfrac{R_{1H} Y_1}{(R_{1H}+Y_1)}\right)}{\bar{V}_{RH}(1-\bar{V}_{RH})} - \dfrac{\bar{V}_{OC}\left(X_1 + \dfrac{R_{1C} Y_1}{(R_{1C}+Y_1)}\right)}{\bar{V}_{RC}(1-\bar{V}_{RC})}}{\left(\dfrac{R_{1C}}{R_{1C}+Y_1}\right)^2 - \left(\dfrac{R_{1H}}{R_{1H}+Y_1}\right)^2}$$

$$\Delta X_1 = \frac{\bar{V}_{OC}\left(X_1 + \dfrac{R_{1C} Y_1}{R_{1C}+Y_1}\right)}{\bar{V}_{RC}(1-\bar{V}_{RC})} + \left(\dfrac{R_{1C}}{R_{1C}+Y_1}\right)^2 \Delta Y_1$$

FIG. 21.

$$\frac{\Delta Y_1}{Y_1} = \frac{\dfrac{\bar{V}_{OC}(R_{2C}+X_2)}{\bar{V}_{LC}(1-\bar{V}_{LC})} - \dfrac{\bar{V}_{OH}(R_{2H}+X_2)}{\bar{V}_{LH}(1-\bar{V}_{LH})}}{R_{1H}\dfrac{(R_{2H}+X_2)\bar{V}_{RH}(1-\bar{V}_{RH})}{(R_{1H}+Y_1)\bar{V}_{LH}(1-\bar{V}_{LH})} - \dfrac{R_{1C}(R_{2C}+X_2)\bar{V}_{RC}(1-\bar{V}_{RC})}{(R_{1C}+Y_1)\bar{V}_{LC}(1-\bar{V}_{LC})}}$$

$$\Delta X_2 = \left(\frac{R_{2C}}{(R_{2C}+Y)}\frac{\bar{V}_{RC}(1-\bar{V}_{RC})\Delta Y_1}{\bar{V}_{LC}(1-\bar{V}_{LC}) Y_1} + \frac{\bar{V}_{OC}}{\bar{V}_{LC}(1-\bar{V}_{LC})}\right)(R_{2C}+X_2)$$

FIG. 22.

$$\frac{\triangle Y_2}{Y_2} = \frac{\dfrac{\overline{V}_{OH}(R_{1H}+X_1)}{\overline{V}_{RH}(1-\overline{V}_{RH})} - \dfrac{\overline{V}_{OC}(R_{1C}+X_1)}{\overline{V}_{RC}(1-\overline{V}_{RC})}}{\dfrac{R_{2H}(R_{1H}+X_1)\overline{V}_{LH}(1-\overline{V}_{LH})}{(R_{2H}+Y_2)\overline{V}_{RH}(1-\overline{V}_{RH})} - \dfrac{R_{2C}(R_{1C}+X_1)\overline{V}_{LC}(1-\overline{V}_{LC})}{(R_{2C}+Y_2)\overline{V}_{RC}(1-\overline{V}_{RC})}}$$

$$\triangle X_1 = \left( \frac{R_{2C}}{(R_{2C}+Y)} \frac{\overline{V}_{LC}(1-\overline{V}_{LC})\triangle Y_2}{\overline{V}_{RC}(1-\overline{V}_{RC})\,Y_2} - \frac{\overline{V}_{OC}}{\overline{V}(1-\overline{V})} \right)(R_{1C}+X_1)$$

FIG. 23.

$$\triangle Y_2 = \frac{\dfrac{\overline{V}_{OC}\left(X_2 + \dfrac{R_{2C}Y_2}{(R_{2C}+Y_2)}\right)}{\overline{V}_{LC}(1-\overline{V}_{LC})} - \dfrac{\overline{V}_{OH}\left(X_2 + \dfrac{R_{2H}Y_2}{(R_{2H}+Y_2)}\right)}{\overline{V}_{LH}(1-\overline{V}_{LH})}}{\left(\dfrac{R_{2C}}{R_{2C}+Y_2}\right)^2 - \left(\dfrac{R_{2H}}{R_{2H}+Y_2}\right)^2}$$

$$\triangle X_2 = \frac{\overline{V}_{OC}\left(X_2 + \dfrac{R_{2C}Y_2}{(R_{2C}+Y_2)}\right)}{\overline{V}_{LC}(1-\overline{V}_{LC})} - \left(\frac{R_{2C}}{R_{2C}+Y_2}\right)^2 \triangle Y_2$$

FIG. 24.

TEMPERATURE COMPENSATION OF A RESISTANCE BRIDGE CIRCUIT

BACKGROUND OF THE INVENTION

This invention relates to a method of providing temperature compensation for resistive bridge circuits, and to compensated bridge circuits when produced by the aforesaid method.

It is known to provide transducers which comprise four piezo-resistive strain gauges which are arranged as a Wheatstone bridge, the temperature co-efficients of resistance (TCR) of each of the piezo-resistive elements being substantially constant over the temperature range at which the transducer is required to operate. However, as a result of manufacturing tolerances the resistances of the four bridge elements are rarely equal at a zero value of the input quantity to which the transducer is intended to respond, the transducer output voltage at zero input being referred to as zero error. Additionally the TCRs of the bridge elements are rarely equal, so that the zero error also changes with temperature.

Additionally the transducer sensitivity, expressed as change in output voltage for a given change of input value and unit supply voltage across the bridge, also changes with temperature.

It has previously been proposed to reduce both the zero error, and the change in this error as a result of temperature change, by inserting two compensating resistances which are respectively in parallel and in series with selected piezo-resistive elements of the bridge circuit, the compensating resistances having very low temperature co-efficients of resistance. It has also been previously proposed to maintain the transducer sensitivity substantially constant by introducing resistor/thermistor networks into the bridge power supply and into each half of the bridge circuit on either side of the output connections. The components of the relatively complex networks required for the aforesaid sensitivity compensation interact with each other and with the zero-compensating resistances. The complexity of these known compensating arrangements makes it difficult or impossible to provide both zero-level compensation and sensitivity compensation such that the characteristics of the compensated transducer may accurately be predicted.

SUMMARY OF THE INVENTION

It is an object of the present invention to provide a method whereby a resistive bridge circuit may be compensated by means of four resistances which have substantially constant resistances over a predetermined temperature range, the compensation providing a reduced zero error which is substantially constant over said temperature range, and also providing a bridge sensitivity which is substantially constant over said range.

It is a further object of the invention to provide compensation for zero error and sensitivity as aforesaid, in such a way that the resultant zero error and sensitivity are predictable, whereby a plurality of compensated transducers of substantially identical characteristics may be produced.

According to the invention there is provided a method of temperature compensation for a transducer which comprises four resistors arranged as a bridge circuit, said method comprising connecting first and second compensating resistances respectively in series and in parallel with selected ones of two adjacent resistors in said bridge circuit, and connecting third and fourth compensating resistances respectively in series with a voltage supply connection to said bridge circuit and in parallel with said circuit, said compensating resistances providing the only compensating elements so connected and having substantially constant values over the temperature range for which the transducer is to be compensated, the values of said compensating resistances and the positions of said first and second resistances being such that the zero error of the transducer is substantially reduced, and that changes in said error and in the transducer sensitivity as a result of temperature changes over said range are also reduced.

In a particular embodiment the values of said compensating resistances and the positions of said first and second resistances are determined by steps which include:

(i) measuring, for said bridge circuit prior to inclusion of said compensating resistances, and at a plurality of predetermined temperature levels, values of two adjacent ones of said four bridge resistors, (ii) measuring, at said temperature levels, the bridge output voltage at a zero level of the input quantity to which the transducer will respond, the bridge sensitivity, the voltage levels at the output connections for the bridge circuit, and the bridge input resistance, (iii) determining from said measurements the required positions of said first and second compensating resistances, (iv) calculating the values of said first and second resistances corresponding to said required positions, (v) calculating the values of said third and fourth compensating resistances, (vi) connecting resistances corresponding to said calculated values in appropriate positions in said bridge circuit.

In a preferred embodiment said method also includes the steps of:

(vii) measuring, at an upper temperature level and in a bridge configuration in which the junction of said adjacent resistors and an opposite junction provide output connections for the bridge, the bridge output voltage at a zero level of said input quantity, (viii) measuring, at the temperature level of the foregoing step and in a bridge configuration in which said junctions are connected across said voltage supply, the bridge output voltage at a zero level of said input quantity, (ix) selecting the one of said configurations in which reversal of the polarity of the supply voltage at the upper temperature level affects the polarity of the output voltage but does not substantially affect the magnitude thereof, (x) measuring the bridge input resistance in said selected configuration, (xi) calculating the values of said third and fourth compensating resistances from the values obtained from steps (ii) and (x).

In another preferred embodiment the method includes the additional steps of:

(xii) re-measuring, in said selected configuration and at said plurality of temperature levels, the output voltage at said zero level input, the bridge sensitivity, the bridge voltage drop, and the voltages at the bridge output connections, (xiii) using the values obtained from the preceding step to recalculate the values of said compensating resistances, and (xiv) fitting to said bridge circuit four compensating resistances having the values obtained from the preceding step.

In a particular embodiment said plurality of temperature levels comprises two temperature levels only, and said bridge sensitivity is determined from two levels only of said input quantity.

BRIEF DESCRIPTION OF THE DRAWINGS

An embodiment of the invention will now be described by way of example only and as applied to temperature compensation of a piezo-resistive pressure transducer. In the accompanying drawings:

FIG. 16 shows a method of calculating any additional corrections required to provide a required sensitivity of the transducer, FIGS. 17, 18, 19 and 20 show methods of calculating any additional corrections required for the zero-level compensating resistances, for the positions thereof respectively shown in FIGS. 5 to 8, and in the connection configuration shown in FIG. 2, FIGS. 21, 22, 23 and 24 show methods of calculating any additional corrections required for the zero-level compensating resistances, for the positions thereof respectively shown in FIGS. 5 to 8, and in the connection configuration shown in FIG. 3.

DETAILED DESCRIPTION OF PREFERRED EMBODIMENTS

Figure 1:
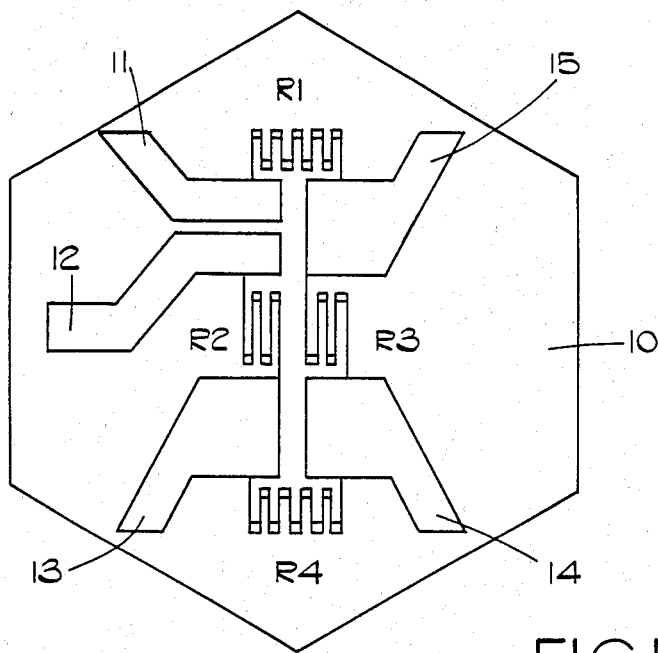
FIG. 1 is a plan view of a diaphragm of a pressure transducer which includes a resistive bridge circuit.

As shown in FIG. 1 a silicon diaphragm 10 is locally doped with germanium to provide four resistors R1, R2, R3, R4 which are arranged as a Wheatstone bridge circuit. The diaphragm 10 forms part of a pressure transducer of the type available from Kulite Sensors Limited of Basingstoke, England and is such that strain of the diaphragm due to increasing pressure causes the values of resistors R1 and R4 to rise, and the values of resistors R2 and R3 to fall. Terminals 11, 12, 13, 14, 15 are provided on the diaphragm 10 between the resistor elements of the bridge circuit.

Figures 2, 3:
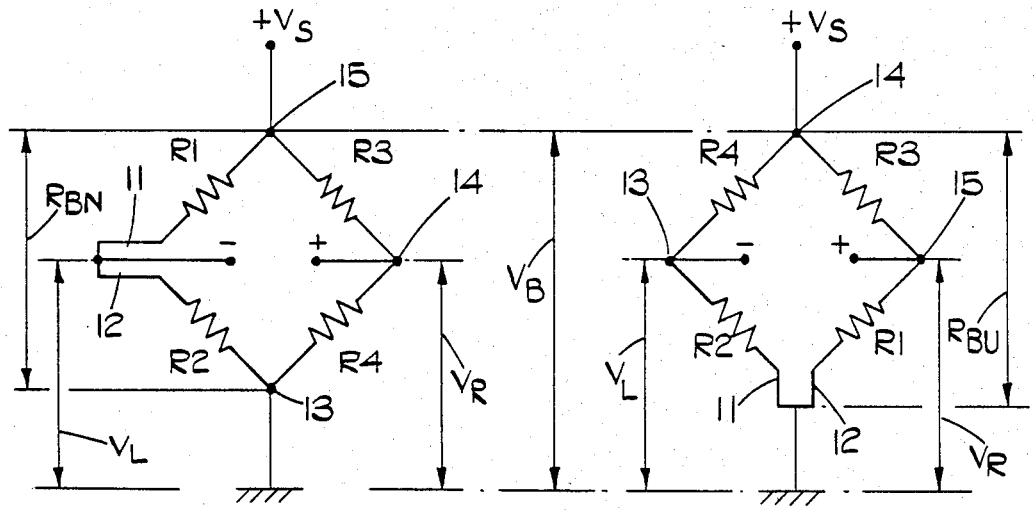
FIGS. 2 and 3 show alternative configurations in which the bridge circuit may be connected, FIG. 4 indicates a method of determining the positions of zero error compensating resistances.

The bridge circuit may be connected in the configuration shown in FIG. 2, in which a supply voltage $V_s$ is applied across the terminals 13, 15 and the bridge output voltage is obtained from terminal 14 and an element which interconnects terminals 11 and 12. This configuration will hereinafter be referred to as the natural configuration N.

Alternatively the bridge circuit may be connected in the configuration shown in FIG. 3, in which the supply voltage Vs is applied across the terminal 14 and an element which interconnects terminals 11 and 12, and in which the bridge output voltage is obtained from the terminals 13 and 15. The latter configuration is hereinafter referred to as the unnatural configuration U.

The voltages $V_L$ and $V_R$ are those at the respective left hand and right hand terminals of the bridge circuit, in the connection configuration of FIG. 2 or FIG. 3, as appropriate. The values $R_{BN}$ and $R_{BU}$ are the total bridge input resistances in the respective connection configurations, and the voltage $V_B$ is the value of the drop in the supply voltage across the bridge, in the appropriate configuration.

The positions and values of compensating resistances, when the transducer is required to operate between $-54°$ C. and $+180°$ C., are determined as follows.

The transducer is initially subjected to temperature cycling over the above range until repeatable values of output voltage, for a predetermined value of input pressure and supply voltage Vs, are obtained. With the transducer connected in the 'natural' configuration shown in FIG. 2 and with the supply voltage Vs set to 5 volts, the following values are measured at a temperature of $-25°$ C.

$V_O$: the transducer output voltage at a pressure of 0 N/M$^2$, $R_1, R_2$: the resistance values of resistors R1, R2 respectively, $V_L, V_R$: the left and right hand voltages, as above defined, $R_{BN}$: the bridge input resistance in the natural configuration, as above defined, $R_{BU}$: the bridge input resistance in the natural configuration, as above defined, S: the bridge sensitivity, which is defined as $1.33(V_p - V_o)/V_s$ where $V_p$ is the transducer output voltage at 75% of intended maximum pressure, $V_B$: the voltage across the bridge The foregoing measurements at $-25°$ C. being indicated hereafter and in the drawings by the subscript C (cold). It is to be noted that at this stage of the procedure $V_B = V_s$. The above measurements are repeated at $+125°$ C. and these latter measurements are indicated hereinafter and in the drawings by the subscript H (hot).

The zero output voltage $V_O$ is measured at $+180°$ C., in the connection configuration shown in FIG. 2, and is also measured in that configuration with the polarity of the voltage supply reversed. The voltage $V_O$ is also measured at $+180°$ C. in the configuration shown in FIG. 3, as well as with the supply voltage polarity reversed. From these measurements a configuration is selected in which reversal of the polarity of the supply voltage results in change of sign of the voltage $V_O$, but does not substantially change its magnitude.

The change of transducer zero error with temperature may be either positive or negative, depending on the relative temperature co-efficients of resistance (TCR) of the bridge elements. Moreover, the uncompensated zero error may itself be either positive or negative. The result is that resistances X and Y for zero error compensation may need to be inserted in two arms of the bridge. To simplify the measurement and calculation procedure, zero error compensation is made on the initial assumption that one side of the bridge, in this case the right hand side, comprises two resistors having equal values and TCRs.

The values of the zero error compensating resistances X, Y, are required to be such that $V_L = V_R$ at both $-25°$ C. and $+125°$ C. when the input pressure is 0 N/M². That is, for each of the arrangements shown in FIGS. 5 to 8 the values of the zero error compensating resistances X, Y, should be such that, $$V_{LC} - V_{RC} = 0 \quad (1)$$

and $$V_{LH} - V_{RH} = 0 \quad (2)$$

The values of $V_{RC}$ and $V_{RH}$ are measured as aforesaid. $V_{LC}$ may be expressed in terms of $V_{BC}$, $R_{1C}$, $R_{2C}$ X and Y; and $V_{LH}$ may be expressed in terms of $V_{BH}$, $R_{1H}$, $R_{2H}$, X and Y, whereby (1) and (2) have become two equations whose unknowns are X and Y and which, for the alternative arrangements shown in FIGS. 5 to 8, may be resolved into the quadratic equations in X and Y shown in FIGS. 9 to 12 respectively, the co-efficients of X and Y being obtainable from the previously measured values. In these equations $$\overline{V_R} = V_R / \overline{V_B} \quad (3)$$

Figure 4:
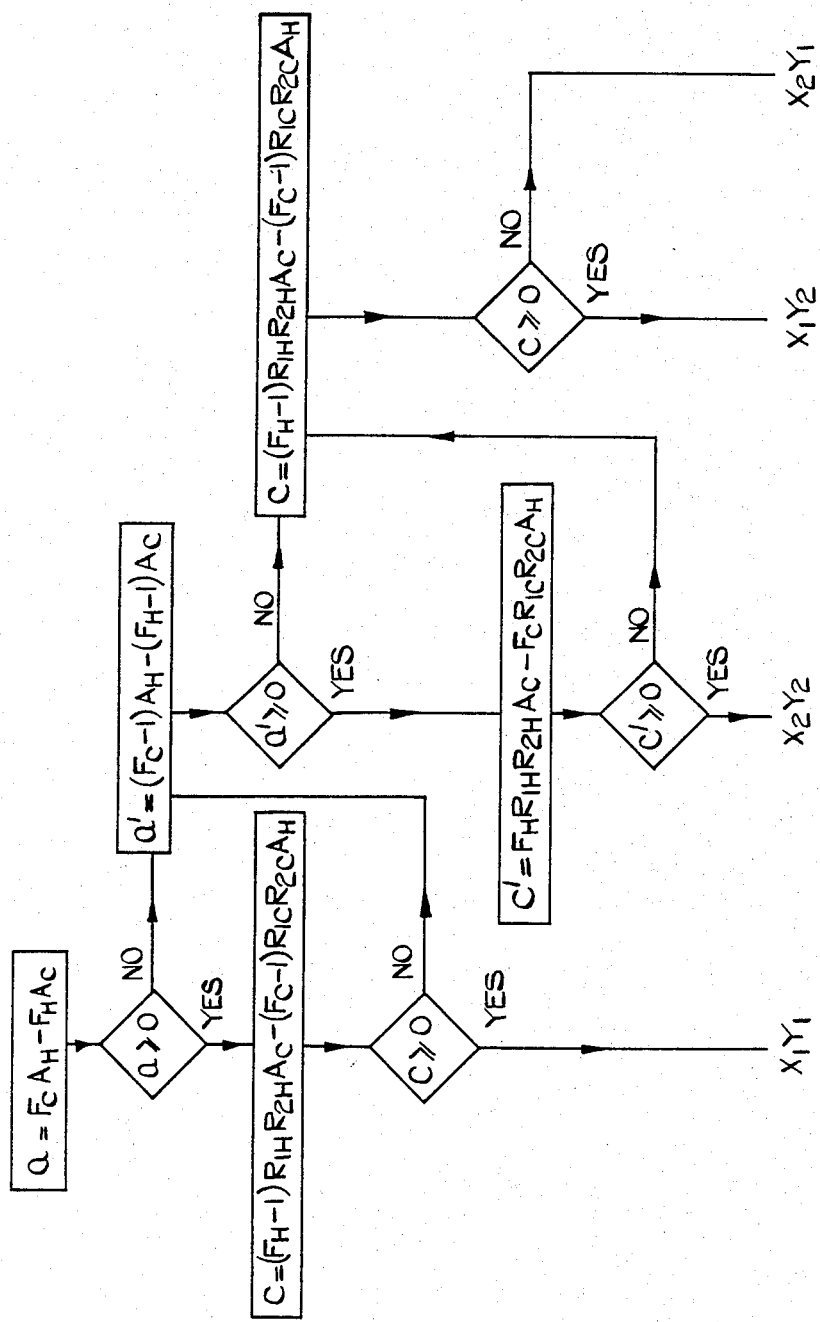
Figure 5:
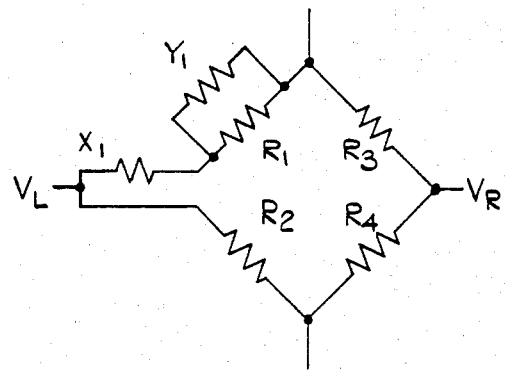
FIGS. 5, 6, 7 and 8 show alternative positions of zero error compensating resistances, as determined by the method of FIG. 4, FIGS. 9, 10, 11 and 12 show methods of calculating the values of the zero error compensating resistances, for the positions shown in FIGS. 5 to 8 respectively.
Figure 6:
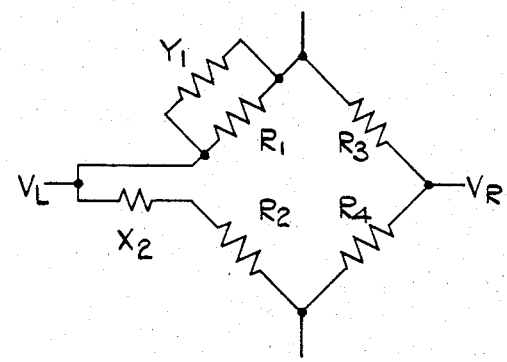
Figure 7:
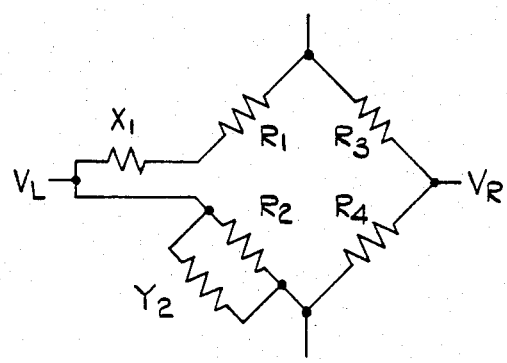
Figure 8:
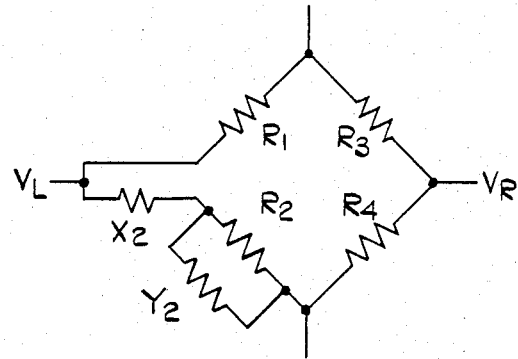

The one of the quadratic equations shown in FIGS. 9 to 12 which produces a real and positive root is that which indicates the required positions of the zero error compensating resistances X and Y. In advance of the values of calculation of X and Y the appropriate one of the quadratic equations of FIGS. 9 to 12 may be determined from the flow chart of FIG. 4. As shown in FIG. 4, a value a is first calculated, and subsequently values a', c or c', in dependence on the result of a previous calculation, this flow chart also indicating the appropriate positions of the resistances X and Y. For the flow chart the following values are calculated;

$$A_C = V_{OC}(R_{1C} + R_{2C})/V_{BC} \quad (4)$$

$$A_H = V_{OH}(R_{1H} + R_{2H})/V_{BH} \quad (5)$$

$$F_C = V_{RC}/V_{BC} \quad (6)$$

$$F_H = V_{RH}/V_{BH} \quad (7)$$

Equations (4) and (5) above are used to introduce the output voltage $V_o$ into the expressions in the flow chart of FIG. 4. Since $V_o$ is nearly zero, measurements of this value may be obtained with considerable accuracy, which facilitates proper selection of the appropriate routes from the flow chart.

After determination of the correct positions for the zero error compensating resistances X and Y, the values of these resistances, for their appropriate positions, are calculated from selected ones of the equations in FIGS. 9 to 12.

The resistance $R_B$ of the bridge as a whole increases with increase in temperature. However, the temperature co-efficient of the transducer gauge factor, that is the change in sensitivity S in response to temperature increase, is dependent on the doping level of the bridge resistors and is arranged to be always negative. That is, the change in transducer output voltage, for unit pressure change and unit bridge voltage $V_B$, falls with increasing temperature. It is thus possible to calculate the value of a resistance $R_s$ which, when placed in series with the bridge voltage supply, will cause the bridge voltage to increase with temperature at the same rate at which its sensitivity would fall, if uncompensated. This series resistance $R_2$ can thus provide that the sensitivity remains constant with temperature. The additional use of a further resistance $R_p$ in parallel with the bridge will enable the sensitivity to be set to a predetermined level.

Figures 13, 14, 15:
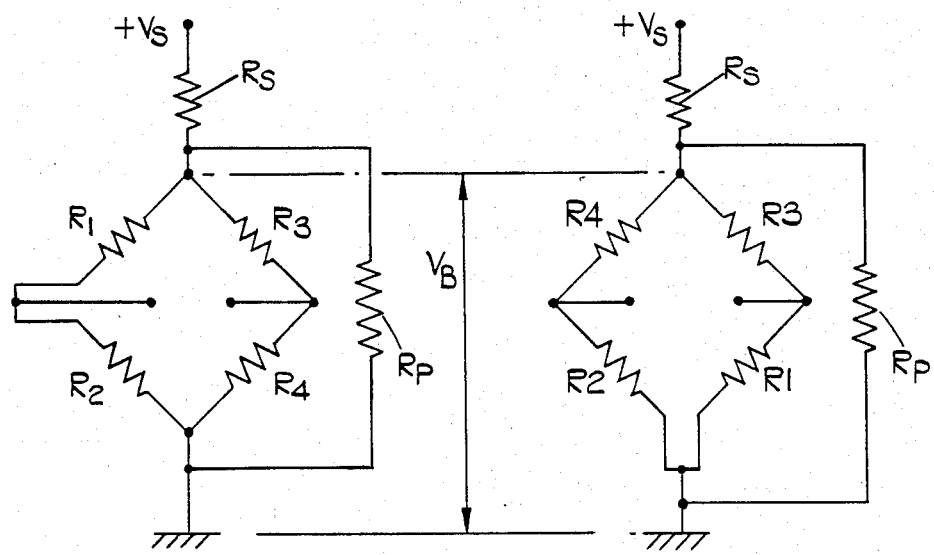
FIGS. 13 and 14 show the positions of two sensitivity compensating resistances in respective alternative connection configurations of the transducer.
FIG. 15 shows a method of calculating the values of the two sensitivity compensating resistances.

The transducer is connected in the previously selected one of the configurations shown in FIGS. 2 and 3, that is the connection configuration in which, at $+130°$ C. reversal of the polarity of the supply voltage $V_s$ causes reversal of the polarity of the zero-pressure output voltage $V_o$, but not of its magnitude. The resistances $R_s$ and $R_p$ are shown in FIGS. 13 and 14 respectively as being connected in the natural (N) and unnatural (U) configurations.

The required sensitivity $S_D$, for a given supply voltage $V_s$ must be such that:

$$S_D = S_C = S_H \quad (8)$$

The bridge voltages $V_{BC}$ and $V_{BH}$ can be expressed in terms of the supply voltage $V_s$, the series and parallel resistance $R_s$, $R_p$ and the bridge input resistance $R_{BC}$ and $R_{BH}$ (FIGS. 2 and 3) at $-25°$ C. and $+125°$ C. respectively, the values of the resistances $R_s$ and $R_p$ being assumed to be constant over the foregoing temperature range.

The two equations for the respective cold (C) and hot (H) conditions have $R_s$ and $R_p$ as their unknowns, and may be resolved into the equations (9) and (10) shown in FIG. 15. Sensitivity compensation resistances having values corresponding to the calculated values of $R_s$ and $R_p$ are connected into the transducer circuit. These compensating resistances may at this stage be provided by adjustable resistance devices, for example decade resistance units.

Zero error compensating resistances, having values corresponding to the calculated values for X and Y, are also connected into the bridge circuit at the appropriate positions indicated in FIGS. 5 to 8. It is convenient at this stage that these compensating resistances shall also be provided by adjustable resistance devices, as for example decade resistance units.

As mentioned earlier the zero error compensating resistances and the sensitivity compensating resistances interact. Moreover, the closeness of the compensated values of zero error and sensitivity to their required values over the desired temperature range, will depend on the accuracy of the measurements used for the various calculations. In the particular example here described it is required that the transducer output at 0 N/m² should not exceed ±0.2% of full scale output over the temperature range of $-25°$ C. to $+125°$ C. It is also required that over the same temperature range the variation of the sensitivity S should not exceed ±1% of 8 millivolts per volt of the supply voltage $V_s$. To obtain these levels of consistency, without the need for excessively accurate measurements, further calculations are carried out, for correction of the previously determined values of compensating resistances.

With the supply voltage $V_s$ set to $+10$ volts, and with the previously determined compensating resistances connected as above described, measurements are made of the transducer output $V_o$ at zero input, the bridge voltage drop $V_B$, the transducer sensitivity S, and the voltages $V_L$ and $V_R$ at the transducer output terminals (see FIGS. 2 and 3). These measurements are made at +125° C. and −25° C. in each case, and are, as before, identified by the subscripts H and C respectively.

With the sensitivity compensating resistances $R_p$ and $R_s$ connected as indicated, the bridge voltage drops $V_{BC}$ and $V_{BH}$ may be expressed in terms of the bridge resistances $R_{BC}$ and $R_{BH}$ respectively, together with the resistances $R_p$ and $R_s$.

$$V_s/V_{BC} = 1 + R_s(1/R_{BC} + 1/R_p) \tag{11}$$

$$V_s/V_{BH} = 1 + R_s(1/R_{BH} + 1/R_p) \tag{12}$$

Let $\Delta S$ be the difference between the sensitivities $S_c$ and $S_H$, as measured in the foregoing step, and the desired sensitivity $S_D$ at both temperatures. If $\Delta S$ is positive, the corrections $\Delta V_{BC}$ and $\Delta V_{BH}$ which are required to be made to the bridge voltage drop are both negative.

Differentiating (11) and (12) above gives equations (13) and (14) in FIG. 16 from which the equations (15) and (16) for $\Delta R_s$ and $\Delta R_p$ may be derived.

From equations (11) and (12), $1/R_{BC}$ and $1/R_{BH}$ may be expressed in terms of $V_s$, $R_s$, $R_p$, $V_{BC}$ and $V_{BH}$, and these terms substituted for $1/R_{BH}$ and $1/R_{BC}$ in equations (15) and (16). The advantage of this last step is that the values of $V_{BC}$ and $V_{BH}$ have been determined by measurements made after the introduction of the compensating resistors $R_s$ and $R_p$, and thus more reliable.

A series resistance having the value $R_s + \Delta R_s$ and a parallel resistance having the value $R_p + \Delta R_p$ are substituted for the resistances $R_s$ and $R_p$ previously connected. The final series and parallel resistances are preferably provided by aerospace grade bulk metal resistors of the type obtainable from Vishay Resistive Products (UK) Limited, of Swindon, England, defined as the S102 series.

As indicated in equations (1) and (2) above, for minimum zero error it is required that $V_L$ should equal $V_R$ (FIGS. 2 and 3) at both −25° C. and +125° C. when the input pressure is 0 N/m². Moreover, $V_{LC}$ and $V_{LH}$ may be expressed in terms of measured values of the bridge resistors and of the known values of the zero error compensating resistors X and Y previously connected. Expressions may be obtained for each of the four appropriate positions of the resistances X and Y, as shown in FIGS. 5 to 8, and for the two connection configurations, as shown in FIGS. 13 and 14. The required expressions are obtained for the appropriate one of eight possible arrangements, and for that arrangement two expressions, for $V_{LC}$ and $V_{LH}$ respectively, are obtained.

The expressions for the selected arrangement are differentiated for $V_{LC}$, $V_{LH}$ and the resistances X and Y, and the differentials manipulated to give expressions for $\Delta X$ and $\Delta Y$, which correspond to the amounts by which the previously connected resistances X and Y must be altered to provide a more accurate zero compensation. FIGS. 17 to 20 show expressions for $\Delta X$ and $\Delta Y$, whose resistances X and Y are in the positions shown in FIGS. 5 to 8 respectively and the bridge connection configuration is that shown in FIG. 13. FIGS. 21 to 24 show expressions for $\Delta X$ and $\Delta Y$ where resistances X and Y are in the positions shown in FIGS. 5 to 8 respectively and the bridge connection configuration is that shown in FIG. 14. It will be understood that values of $\Delta X$ and $\Delta Y$ calculated from these expressions may be either positive or negative.

Zero error compensating resistances having the values $X + \Delta X$ and $Y + \Delta Y$ are substituted for those originally connected. Preferably the zero error compensating resistances finally inserted are from the Vishay S102 series referred to above.

The foregoing procedure has been found able to produce transducers in which the output at an input of 0 N/m² does not vary by more than ±1.0% of full scale output over a temperature range of −54° C. to +180° C., and in which the sensitivity S, as above defined, does not vary by more than ±0.6% of 8 millivolts/supply voltage. The procedure provides these results without the need for a large number of highly accurate measurements. Since a substantial part of the procedure comprises calculation which can readily be performed by a computer, the ease and speed with which the four compensating resistors may be selected is greatly increased. Furthermore, since the zero error and sensitivity of the compensated transducers can be made to approximate closely to desired values, it is possible to provide a series of transducers having substantially identical characteristics.

The Vishay S102 series resistors referred to above have temperature co-efficients of resistance of 2.5 ppm/° C. It is desirable to use compensating resistances having very low temperature co-efficients, since these resistances will be mounted so as to be spaced from the gauge per se and may not, during transient temperature changes, experience the same temperature as the gauge resistors R1 to R4.

Figure 25:
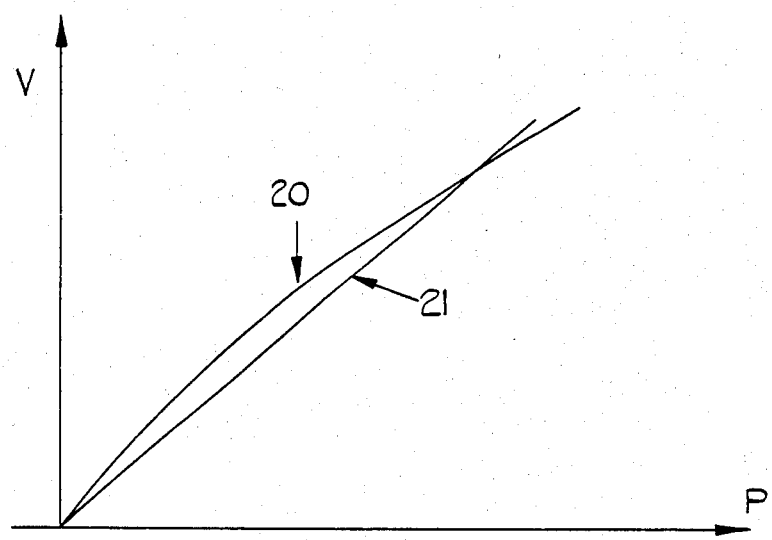
FIG. 25 shows deviation from the required values of sensitivity of a compensated bridge circuit.

Though, after compensation as above, variation in the sensitivity S of the bridge does not exceed ±0.6% of 8 millivolts/supply voltage, the slope of the transducer output voltage $V_1$ plotted against increasing pressure P may be, as indicated in FIG. 25, a curve 20 instead of the required linear relationship 21. The deviations of the curve 20 from the line 21, over the intended range of pressure P may be measured and used to compile a correction table. Preferably the correction table will take the form of a look-up table in a store of a computer, which may be the same computer that has been used to effect the foregoing compensation. Moreover, since the deviation values are substantially identical for all bridge circuits in a series as aforesaid, the correction table may be used for all bridge circuits of that series.

Figure 26:
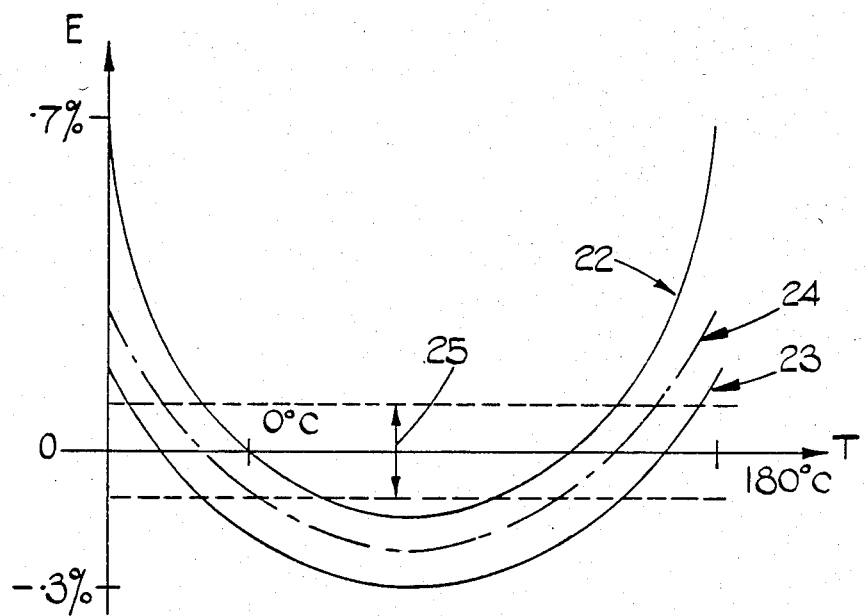
FIG. 26 shows deviation from required values of zero error of a compensated bridge circuit.

As indicated above the zero error may vary between ±0.7% of full scale output over a temperature range of −54° C. to +180° C. FIG. 26 shows typical curves 22, 23 of zero error E plotted against temperature T, the area between the curves 22, 23 representing the range of zero error typically obtainable over a series of nominally identical bridge circuits which have been compensated as described above.

If the transducer is to be used over a small range of input pressures, it may be necessary to apply a further correction so that the zero error is less than ±0.2%.

The values represented by the curves 22, 23 may be used to determine median values 24 of zero error $V_E$ for the bridges of the series and a correction table prepared based on the deviation of these median values from zero. This correction table may be a look-up table stored in a computer, which may be the same computer that has been used to effect the compensation calculations. The corrected values, based on the median values 24, provide a zero error of ±0.1%, as indicated at 25 in FIG. 26.

The foregoing corrections over the ranges of pressure P and temperature T are applied at the values of these quantities to which the transducer is, at the relevant time, subjected.

I claim:

1. A method of temperature compensation for a transducer which comprises four resistors arranged as a bridge circuit, said method comprising: connecting first and second compensating resistances, respectively, in series and in parallel with selected ones of two adjacent resistors in said bridge circuit; and connecting third and fourth compensating resistances, respectively, in series with a voltage supply connection to said bridge circuit and in parallel with said bridge circuit, said compensating resistances providing the only compensating elements so connected and having substantially constant values over the temperature range for which the transducer is to be compensated, the values of said compensating resistances and the positions of said first and second resistances being such that zero error of the transducer is substantially reduced, and that changes in said error and in the transducer sensitivity as a result of temperature changes over said range are also reduced.

2. A method of temperature compensation in a transducer responsive to an input quantity, wherein said transducer comprises four resistors arranged as a bridge circuit and four compensating resistances, first and second compensating resistances connectable in series and in parallel, respectively, with selected ones of two adjacent resistors in said bridge circuit and, third and fourth compensating resistances connectable in series with a voltage supply connection to said bridge circuit and in parallel with said bridge circuit, respectively, said compensating resistances providing the only temperature compensation elements so connected and having substantial constant values over the temperature range for which the transducer is to be compensated, said method comprising the steps of:

making measurements at a plurality of predetermined temperature levels, said measurements including the resistance values of two adjacent ones of said bridge resistors, the bridge output voltage at a zero level of said input quantity, the voltage levels at the separate output connections of the bridge circuit, and the bridge resistance;

determining from said measurements, the required connections to the bridge circuit of said first and second compensating resistances;

calculating, from said measurements, the values of said first and second resistances;

calculating, from said measurements and from a required value of the sensitivity of said bridge circuit, the values of said third and fourth compensating resistances; and connecting compensating resistances having values of resistance corresponding to the calculated values at the determined locations in said bridge circuit.

3. A method of temperature compensation as claimed in claim 2, wherein:

said making of measurements step includes the steps of measuring the bridge output voltage at an upper temperature level and at a zero level of said input quantity, in a configuration of said bridge in which the junction of said adjacent resistors, and an opposite junction, provide the output connections of the bridge; and measuring the bridge output voltage at said upper temperature level of the foregoing step and at a zero level of said input quantity, in a configuration of the bridge in which said junctions are connected across a supply voltage;

said determining step includes the step of selecting the one of said configurations in which reversal of the polarity of the supply voltage at said upper temperature level affects the polarity of the output voltage but does not substantially affect the magnitude thereof; and measuring the bridge input resistance in said selected configuration; and said step of calculating of third and fourth compensating resistances comprises calculating the values of said third and fourth compensating resistances from measurements, in said selected configuration, of:

(a) the bridge output voltage at zero level of said input quantity;

(b) the bridge sensitivity;

(c) the voltage level at the seperate bridge output connections; and (d) the bridge input resistance.

4. A method as claimed in claim 3 which includes the additional steps of:

(xii) re-measuring, in said selected configuration and at said plurality of temperature levels, the output voltage at said zero level input, the bridge sensitivity, the bridge voltage drop, and the voltages at the bridge output connections, (xiii) using the values obtained from the preceding step to recalculate the values of said compensating resistances, and (xiv) fitting to said bridge circuit four compensating resistances having the values obtained from the preceding step.

5. A method as claimed in any one of claims 4, 2 or 3 in which said plurality of temperature levels comprises two temperature levels only, and said bridge sensitivity is determined from two levels only of said input quantity.

* * * * *